(12) United States Patent
Matsuda

(10) Patent No.: US 11,056,451 B2
(45) Date of Patent: Jul. 6, 2021

(54) SEMICONDUCTOR DEVICE MANUFACTURING METHOD AND SEMICONDUCTOR DEVICE

(71) Applicant: SUMITOMO ELECTRIC DEVICE INNOVATIONS, INC., Kanagawa (JP)

(72) Inventor: Keita Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 6 days.

(21) Appl. No.: 16/569,251

(22) Filed: Sep. 12, 2019

(65) Prior Publication Data

US 2020/0091098 A1    Mar. 19, 2020

(30) Foreign Application Priority Data

Sep. 19, 2018 (JP) .............................. JP2018-175212

(51) Int. Cl.
*H01L 23/52* (2006.01)
*H01L 25/16* (2006.01)
(Continued)

(52) U.S. Cl.
CPC .............. *H01L 24/05* (2013.01); *H01L 24/03* (2013.01); *H01L 24/11* (2013.01); *H01L 24/13* (2013.01); *H01L 2224/03464* (2013.01); *H01L 2224/03901* (2013.01); *H01L 2224/0401* (2013.01); *H01L 2224/05005* (2013.01); *H01L 2224/05082* (2013.01); *H01L 2224/05083* (2013.01); *H01L 2224/05155* (2013.01); *H01L 2224/05164* (2013.01); *H01L 2224/05166* (2013.01); *H01L 2224/05573* (2013.01);
(Continued)

(58) Field of Classification Search
CPC ....... H01L 23/562; H01L 24/06; H01L 24/03; H01L 23/3171; H01L 24/05; H01L 29/7813; H01L 27/088
See application file for complete search history.

(56) References Cited

U.S. PATENT DOCUMENTS

2005/0062169 A1* 3/2005 Dubin ..................... H01L 24/13
257/779
2007/0210450 A1* 9/2007 Jang ........................ H01L 24/13
257/734
(Continued)

FOREIGN PATENT DOCUMENTS

| JP | 2005-150578 | 6/2005 |
|---|---|---|
| JP | 2007-251158 | 9/2007 |
| JP | 2017-130527 | 7/2017 |

*Primary Examiner* — Brian Turner
(74) *Attorney, Agent, or Firm* — Smith, Gambrell & Russell, LLP.

(57) ABSTRACT

A semiconductor device manufacturing method includes forming an organic insulating layer on a semiconductor on which metal wiring is provided, the organic insulating layer having an opening to expose part of the metal wiring, forming a seed metal covering the part of the metal wiring exposed from the opening, and an inside face and an around portion of the opening of the organic insulating layer, forming a mask covering an edge of the seed metal and exposing part of the seed metal formed in the opening, and forming a barrier metal on the seed metal exposed from the mask by electroless plating. The mask includes an organic material or an inorganic dielectric material.

14 Claims, 12 Drawing Sheets

(51) Int. Cl.
*H01L 21/56* (2006.01)
*H01L 23/31* (2006.01)
*H01L 23/34* (2006.01)
*H01L 23/00* (2006.01)

(52) U.S. Cl.
CPC ............... *H01L 2224/05644* (2013.01); *H01L 2224/05655* (2013.01); *H01L 2224/11849* (2013.01); *H01L 2224/13005* (2013.01)

(56) References Cited

U.S. PATENT DOCUMENTS

| | | | | |
|---|---|---|---|---|
| 2008/0157395 | A1* | 7/2008 | Belanger | H01L 24/05 257/778 |
| 2008/0251940 | A1* | 10/2008 | Lee | H01L 24/86 257/777 |
| 2010/0244241 | A1* | 9/2010 | Marimuthu | H01L 25/0657 257/737 |
| 2010/0290191 | A1* | 11/2010 | Lin | H01L 24/82 361/704 |
| 2011/0024910 | A1* | 2/2011 | Mostafazadeh | H01L 24/05 257/762 |
| 2013/0015576 | A1* | 1/2013 | Lin | H01L 24/11 257/737 |
| 2013/0341785 | A1* | 12/2013 | Fu | H01L 24/05 257/737 |
| 2014/0339699 | A1* | 11/2014 | Arvin | H01L 23/49866 257/738 |
| 2015/0102482 | A1* | 4/2015 | Liu | H01L 23/147 257/737 |
| 2018/0090460 | A1* | 3/2018 | Chu | H01L 23/562 |
| 2018/0337142 | A1* | 11/2018 | Cheng | H01L 23/3128 |
| 2019/0214357 | A1* | 7/2019 | Lee | H01L 24/13 |

* cited by examiner

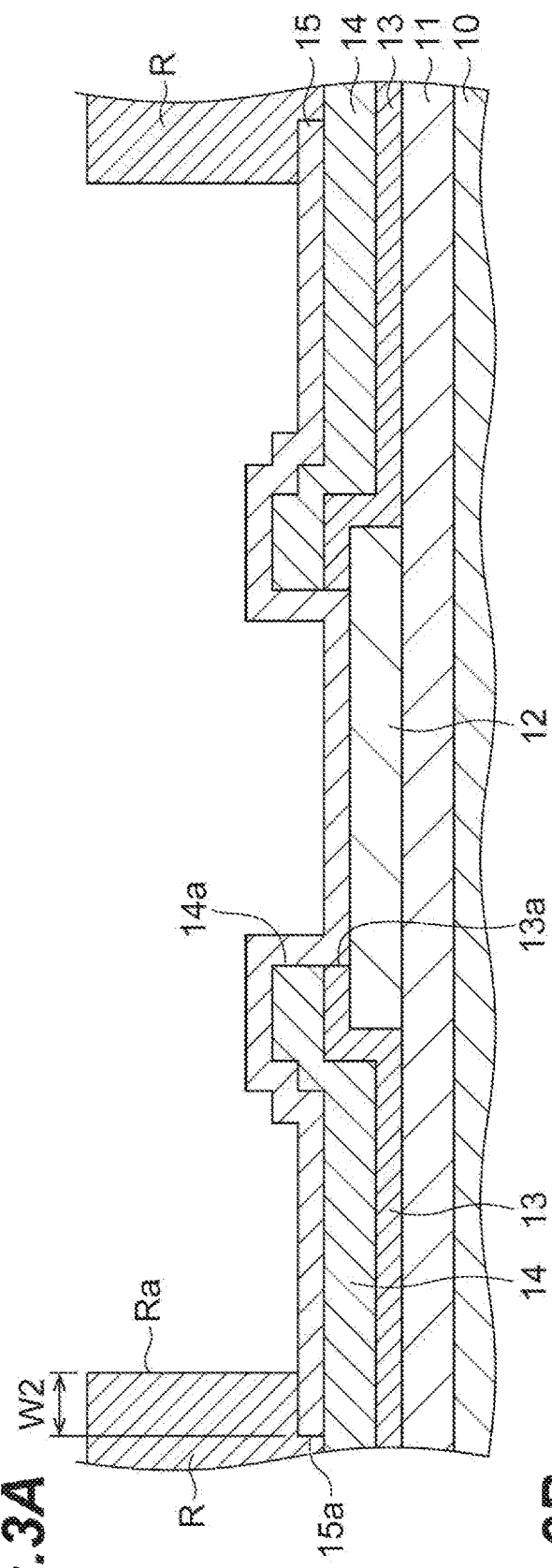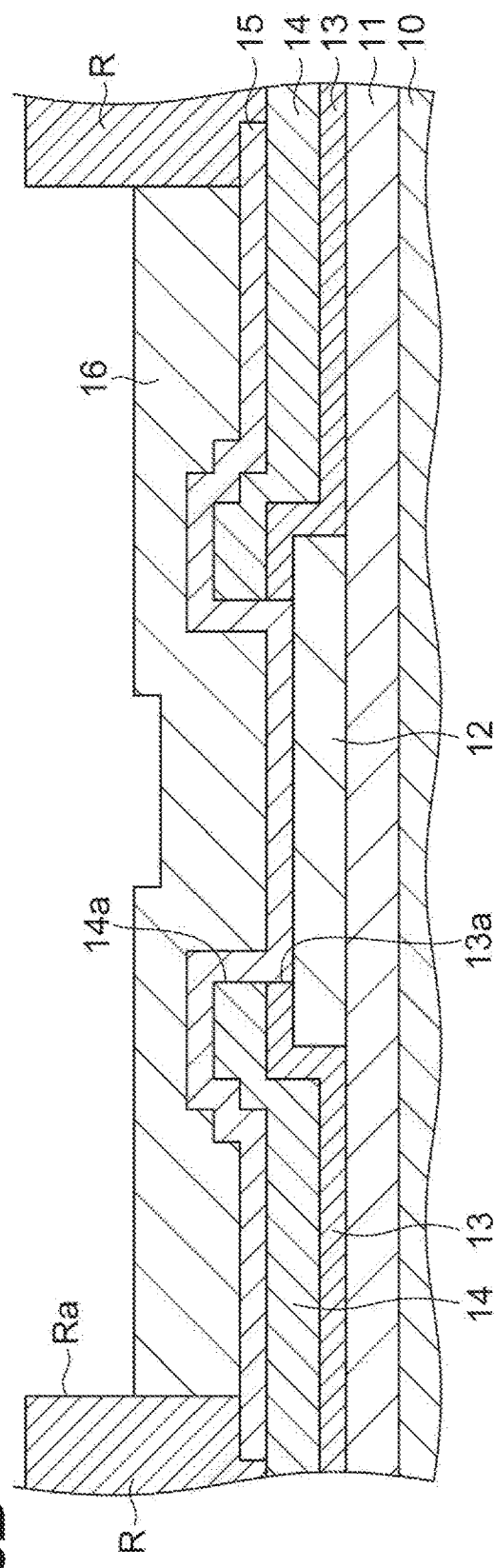

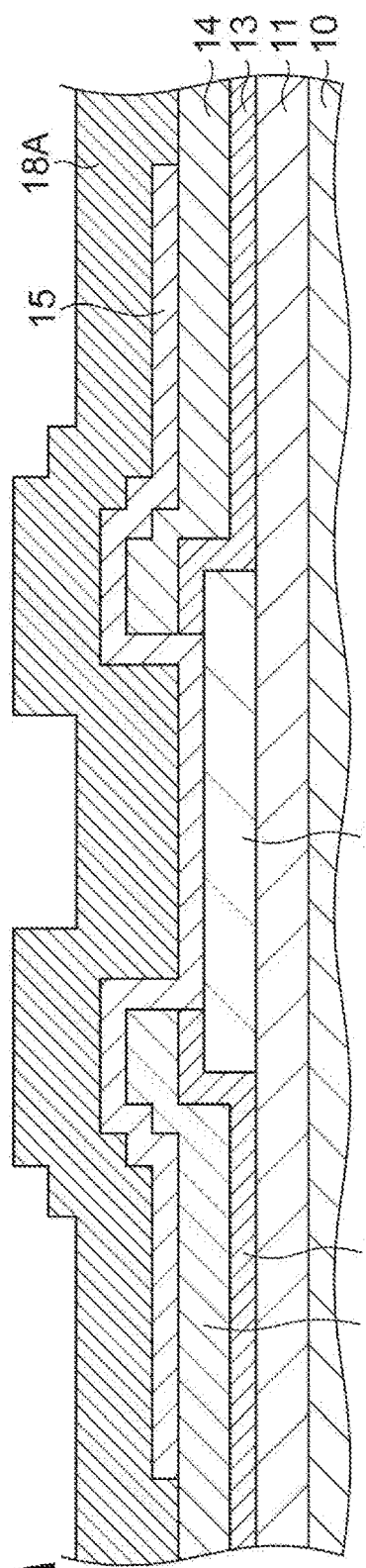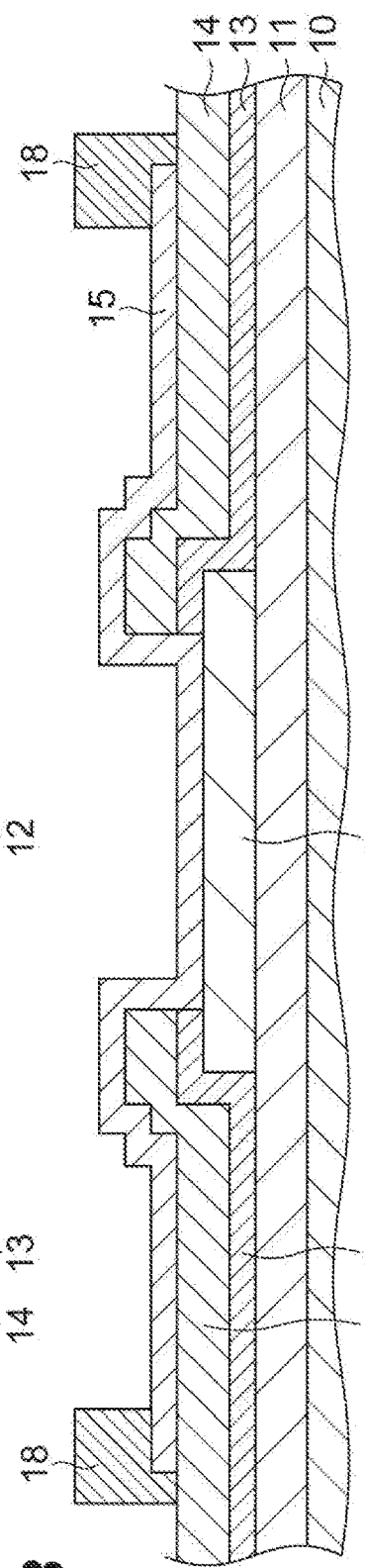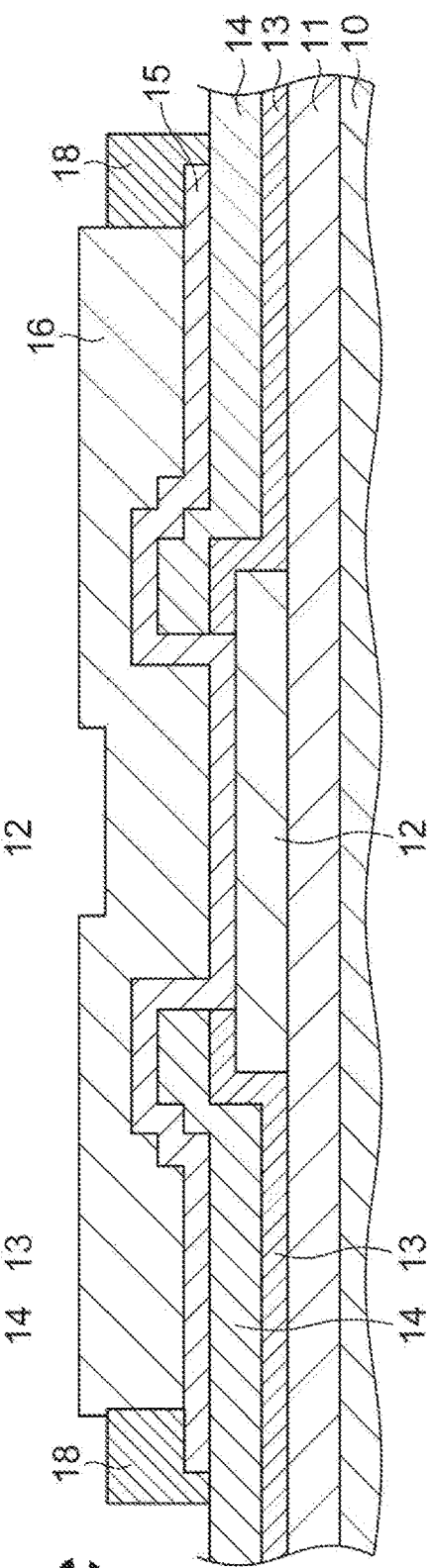

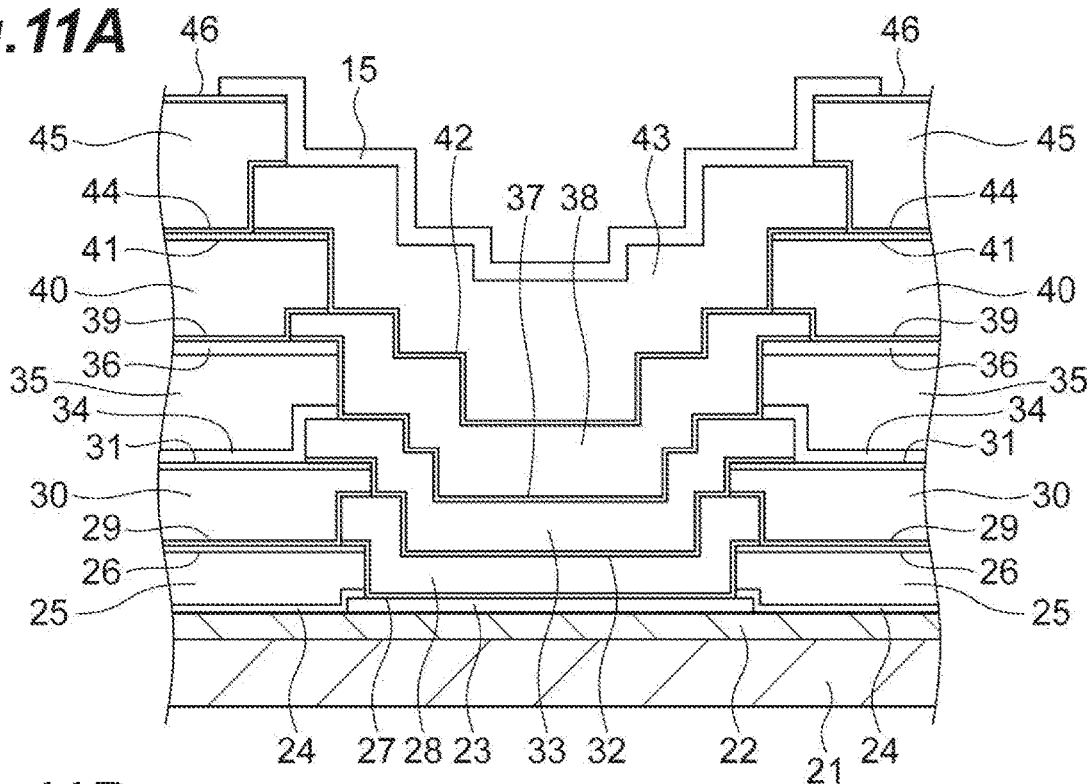
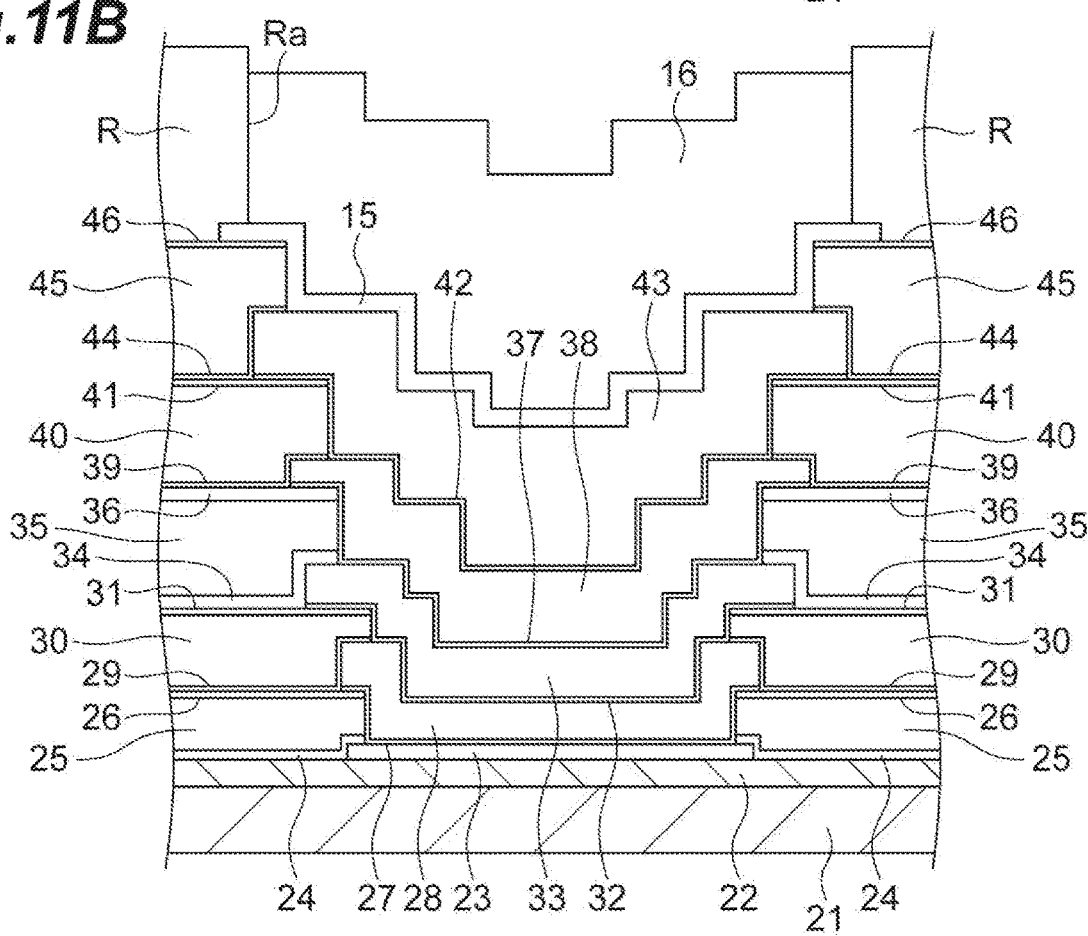

SEMICONDUCTOR DEVICE MANUFACTURING METHOD AND SEMICONDUCTOR DEVICE

CROSS REFERENCE TO RELATED APPLICATIONS

This application claims the benefit of priority from Japanese Application No. JP2018-175212 filed on Sep. 19, 2018, the entire contents of which are incorporated herein by references.

TECHNICAL FIELD

The present disclosure relates to a semiconductor device manufacturing method and a semiconductor device.

BACKGROUND

Japanese Unexamined Patent Publication No. 2005-150578 discloses a technique related to a semiconductor device and a manufacturing method of the semiconductor device. In accordance with the manufacturing method disclosed in Japanese Unexamined Patent Publication No. 2005-150578, redistribution is made using a conductive film (including a Ti film and a Pd film in order from bottom to top) serving as a base film (UBM: Under Bump Metal) of an Au bump. The Ti film and the Pd film are deposited by sputtering. When resistance of the redistribution causes a problem, an Au film is formed on the Pd film to form a redistribution structure having Ti, Pd, Au stacked in this order from bottom to top.

Japanese Unexamined Patent Publication No. 2007-251158 discloses a technique related to a bump formation method. In accordance with the bump formation method disclosed in Japanese Unexamined Patent Publication No. 2007-251158, a diffusion barrier film pattern is formed on a substrate on which a conductive pad is formed, and then a seed film is formed. Next, a conductive bump is formed on the seed film, and the seed film is patterned with the conductive bump serving as an etching mask. A diffusion barrier film pattern is formed through dry etching on the diffusion barrier film, and a seed film pattern is formed through wet etching on the seed film.

Japanese Unexamined Patent Publication No. 2017-130527 discloses a technique related to a semiconductor device. In the semiconductor device disclosed in Japanese Unexamined Patent Publication No. 2017-130527, a source electrode formed on an upper face side of a semiconductor substrate is covered by two types of passivation films (hard passivation film and passivation film). The passivation films covering the source electrode each have an opening, and a UBM serving as a barrier film is formed wider than the opening.

In order to flip-chip mount a semiconductor device on a substrate or the like, a ball grid array (BGA) package may be used. Solder bumps are formed on a wiring layer of such a semiconductor device (see, for example, Japanese Unexamined Patent Publication No. 2005-150578, Japanese Unexamined Patent Publication No. 2007-251158, and Japanese Unexamined Patent Publication No. 2017-130527). In order to suppress mutual diffusion of metal materials between the solder and the wiring layer, a barrier metal layer (UBM) is provided between the wiring layer and the solder bumps. Further, an insulating film such as polyimide is provided on a semiconductor region.

SUMMARY

A semiconductor device manufacturing method according to one aspect of the present disclosure includes: forming an organic insulating layer on a semiconductor on which metal wiring is provided, the organic insulating layer having an opening to expose part of the metal wiring; forming a seed metal covering the part of the metal wiring exposed from the opening, and an inside face and an around portion of the opening of the organic insulating layer; forming a mask covering an edge of the seed metal and exposing part of the seed metal formed in the opening; and forming a barrier metal on the seed metal exposed from the mask by electroless plating. The mask includes an organic material or an inorganic dielectric material

BRIEF DESCRIPTION OF THE DRAWINGS

The foregoing and other purposes, aspects and advantages will be better understood from the following detailed description of a preferred embodiment of the disclosure with reference to the drawings, in which:

FIGS. 3A and 3B are cross-sectional views showing steps in accordance with a manufacturing method of the semiconductor device 1A;

FIGS. 6A to 6C are cross-sectional views showing steps in accordance with a semiconductor device manufacturing method of the second embodiment;

FIGS. 11A and 11B are views showing steps included in the semiconductor device manufacturing method according to the one modification.

DETAILED DESCRIPTION

Figure 1:
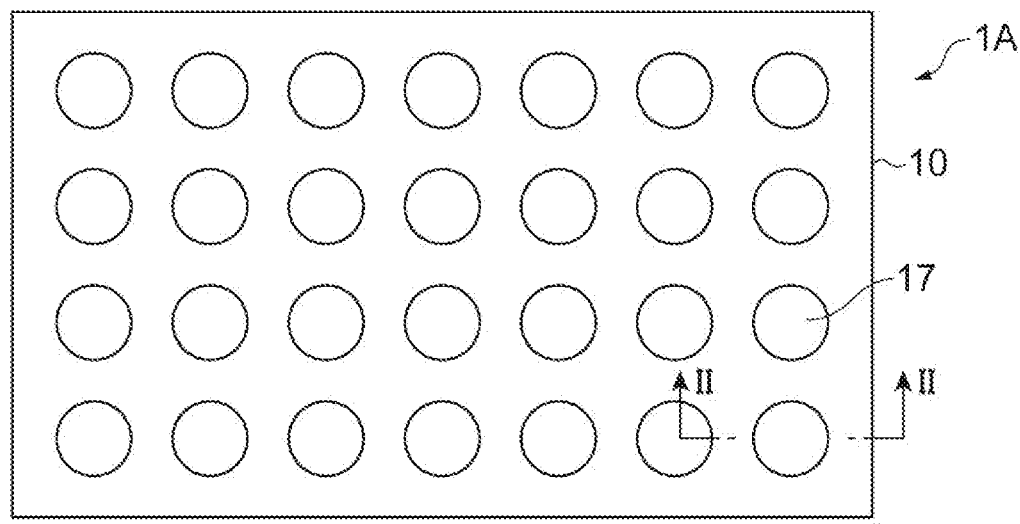
FIG. 1 is a plan view showing a semiconductor device 1A according to a first embodiment.

Problem to be Solved by the Present Disclosure

When adhesiveness between a barrier metal layer serving as a UBM and an insulating film is low, a problem arises that the barrier metal layer is easily separated from the insulating film due to, for example, thermal stress generated when solder balls are mounted. In particular, when the insulating film contains an organic insulator such as polyimide, the above-described problem tends to clearly arise because a difference in thermal expansion coefficient between the barrier metal layer and the organic insulator is large. When a gap is generated between the barrier metal layer and the insulating film, solder may intrude into the gap. When the solder intrudes into the gap, breakage easily occurs at an interface between the barrier metal layer and a wiring layer, which deteriorates reliability of a semiconductor device. This phenomenon occurs at the interface between the barrier metal layer and the wiring layer, and thus, even when the barrier metal layer is made thicker, the phenomenon cannot be eliminated.

One aspect of the present disclosure is a manufacturing method of a semiconductor device including a first step of forming an organic insulating layer on a surface of a semiconductor region where metal wiring is provided, the organic insulating layer having an opening to expose part of the metal wiring, a second step of forming a seed metal layer covering the part of the metal wiring exposed from the opening, an inside face of the opening of the organic insulating layer, and a periphery of the opening of the organic insulating layer, a third step of forming a mask covering an edge of the seed metal layer and exposing part of the seed metal layer formed in the opening, and a fourth step of forming a barrier metal layer on the seed metal layer exposed from the mask by electroless plating. The mask primarily contains an organic material or an inorganic dielectric material.

Effect of the Present Disclosure

According to one aspect of the present disclosure, a semiconductor device manufacturing method and a semiconductor device make it possible to reduce the breakage at the interface between the barrier metal layer and the wiring layer caused by the intrusion of solder and increase the reliability.

DESCRIPTION OF EMBODIMENTS OF THE PRESENT DISCLOSURE

Specific examples of a semiconductor device and manufacturing method thereof according to an embodiment of the present disclosure will be described below with reference to the drawings. Further, it is to be understood that the present disclosure is not limited to these examples but is defined by the scope of the claims and includes all modifications within the meaning and scope equivalent to the claims. In the following description, the same elements are denoted by the same reference numerals in the description of the drawings, and redundant explanations are omitted.

First Embodiment

FIG. 1 is a plan view showing a semiconductor device 1A according to a first embodiment. As shown in FIG. 1, the semiconductor device 1A of the present embodiment is a BGA-type semiconductor device having a plurality of solder balls 17 provided on a surface of a semiconductor region 10. The plurality of solder balls 17 are arranged in a grid pattern on one face of the semiconductor region 10.

Figure 2:
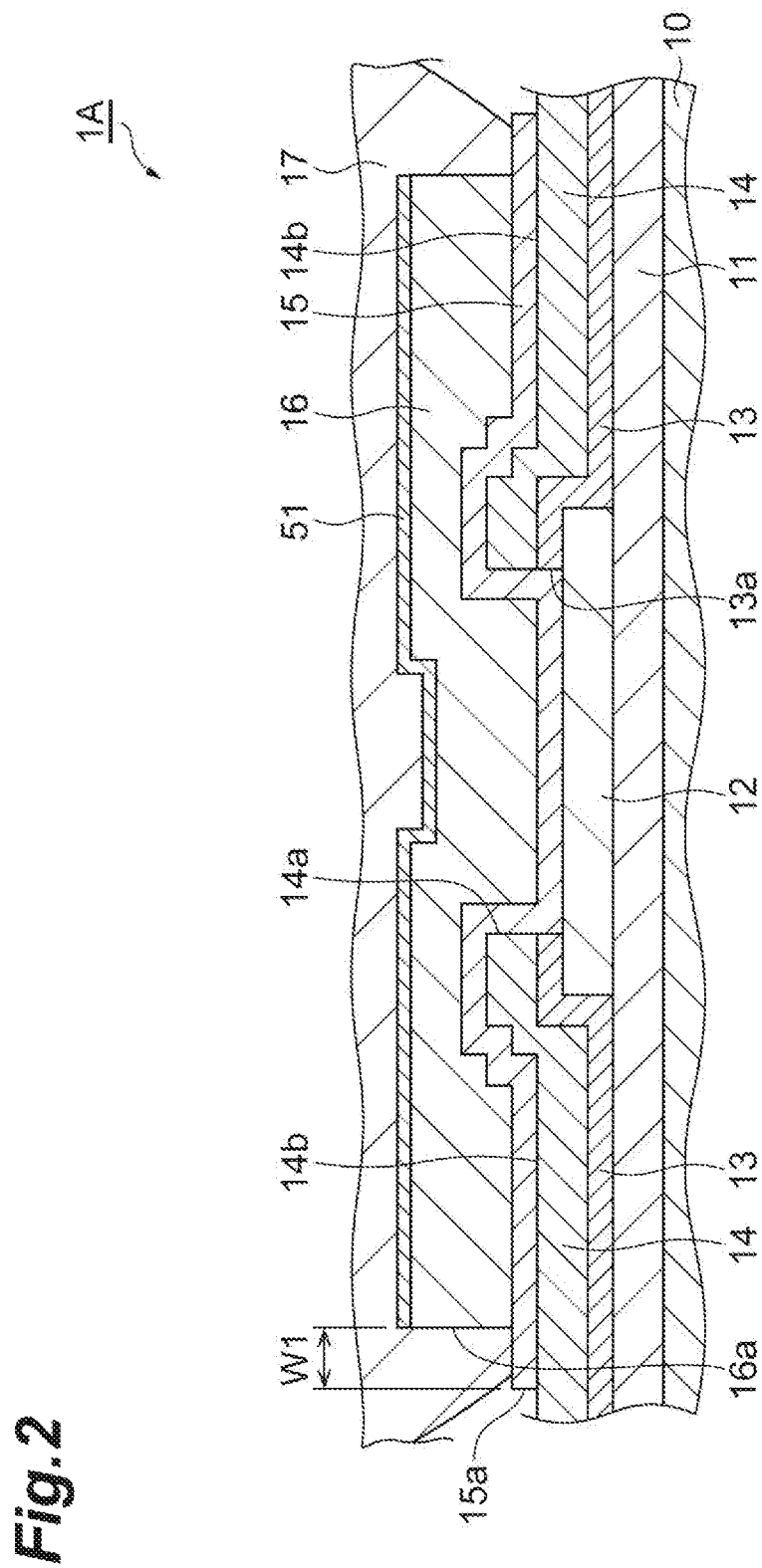
FIG. 2 is an enlarged view of a cross section (a base structure for a solder ball 17) taken along line II-II shown in FIG. 1.

FIG. 2 is an enlarged view of a cross section (a base structure for the solder balls 17) taken along line II-II shown in FIG. 1. As shown in FIG. 2, the semiconductor device 1A includes the semiconductor region 10, metal wiring 12 provided on the surface of the semiconductor region 10, an inorganic insulating layer 11 provided on the surface of the semiconductor region 10, and an organic insulating layer 14. Furthermore, the semiconductor device 1A includes an inorganic insulating layer 13, a seed metal layer 15, a barrier metal layer 16, and the solder ball 17.

For example, the semiconductor region 10 of a nitride semiconductor device includes a channel layer made from gallium nitride (GaN) and a barrier layer made from aluminum gallium nitride (AlGaN) or indium aluminum nitride (InAlN). The semiconductor device 1A having such a configuration constitutes a high-electron-mobility transistor (HEMT). Note that the semiconductor region 10 may include a semiconductor layer for a field effect transistor (FET) other than the HEMT or for any other semiconductor functional device.

The metal wiring 12 is provided on the inorganic insulating layer 11. The metal wiring 12 is connected to an electrode (for example, a source electrode and a drain electrode) that is in ohmic contact with the semiconductor region 10 or an electrode (for example, a gate electrode) that is in Schottky contact with the semiconductor region 10. The metal wiring 12 is made from metal such as gold (Au). The inorganic insulating layer 11 is interposed between the metal wiring 12 and the semiconductor region 10. The inorganic insulating layer 11 is made from a silicon compound such as silicon nitride (SiN). The metal wiring 12 has a thickness in a range of 0.5 µm to 3.0 µm, for example.

The inorganic insulating layer 13 is, for example, an insulating silicon compound layer and is an SiN layer or an $SiO_2$ layer as one example. The inorganic insulating layer 13 is provided on the whole of the semiconductor region 10 and covers the first inorganic insulating layer 11 and the metal wiring 12. The inorganic insulating layer 13 is in contact with the inorganic insulating layer 11. Further, the inorganic insulating layer 11 has an opening 13a on the metal wiring 12 to expose part of the metal wiring 12. When viewed in a thickness direction of the semiconductor region 10, the opening 13a overlaps the solder ball 17. The inorganic insulating layer 13 has a thickness in a range of 0.03 µm to 3 µm, for example.

The organic insulating layer 14 is, for example, a polyimide layer. The organic insulating layer 14 is provided on the whole of the surface of the semiconductor region 10 and covers the inorganic insulating layer 11 and the metal wiring 12. According to the present embodiment, the organic insulating layer 14 is provided on the inorganic insulating layer 13 and is in contact with the inorganic insulating layer 13. Similar to the inorganic insulating layer 13, the organic insulating layer 14 has an opening 14a on the metal wiring 12 to expose the part of the metal wiring 12. When viewed in the thickness direction of the semiconductor region 10, the opening 14a is aligned with the opening 13a of the inorganic insulating layer 13 and overlaps the solder ball 17. The organic insulating layer 14 has a thickness in a range of 1 µm to 6 µm, for example.

The seed metal layer 15 is a layer made from metal such as titanium (Ti) or palladium (Pa), for example. In one example, the seed metal layer 15 includes a Ti layer and a Pd layer provided on the Ti layer. With this configuration, the Ti layer has a thickness in a range of 0.005 µm to 0.1 µm, for example, and has a thickness of 50 nm as one example. Further, the Pd layer has a thickness in a range of 0.01 µm to 0.5 µm, for example, and has a thickness of 100 nm as one example. The seed metal layer 15 is used as a seed metal when the barrier metal layer 16 is formed by electroless plating. Further, the seed metal layer 15 prevents Ni (or NiCr) and Au from forming an alloy when the barrier metal layer 16 contains Ni (or NiCr) and the metal wiring 12 contains Au.

The seed metal layer 15 covers the part of the metal wiring 12 exposed from the openings 13a, 14a, an inside face of the opening 13a of the inorganic insulating layer 13, an inside face of the opening 14a of the organic insulating layer 14, and a surface 14b of the organic insulating layer 14 on a periphery of the opening 14a. According to the present embodiment, the seed metal layer 15 is in contact with the part of the metal wiring 12 exposed from the openings 13a, 14a, the inside face of the opening 13a of the inorganic insulating layer 13, the inside face of the opening 14a of the organic insulating layer 14, and the surface 14b of the organic insulating layer 14 on the periphery of the opening 14a.

The barrier metal layer 16 is a layer made from metal such as nickel (Ni) or a nickel-chromium alloy (NiCr). The barrier metal layer 16 is provided to prevent mutual diffusion of solder constituting the solder ball 17 and gold (Au) constituting the metal wiring 12. The barrier metal layer 16 is provided on the seed metal layer 15 and is in contact with the seed metal layer 15. When the barrier metal layer 16 is an Ni layer, the barrier metal layer 16 has a thickness in a range of 3 μm to 6 μm, for example.

When viewed in the thickness direction of the barrier metal layer 16, an edge (outer edge) 16a of the barrier metal layer 16 is located inside (located closer to the opening 14a than) an edge (outer edge) 15a of the seed metal layer 15. In other words, when viewed in the thickness direction of the barrier metal layer 16, the barrier metal layer 16 is provided inside the seed metal layer 15. The edge 16a of the barrier metal layer 16 does not extend beyond the edge 15a of the seed metal layer 15, so that the barrier metal layer 16 and the organic insulating layer 14 are not in contact with each other (are separated from each other). A distance W1 from the edge 15a of the seed metal layer 15 to the edge 16a of the barrier metal layer 16 is in a range of 4 μm to 8 μm, for example. Note that the seed metal layer 15 and the barrier metal layer 16 have a circular shape in plan view, for example.

The solder ball 17 has a substantially sphere-like structure made from metal such as an alloy of tin and silver (Sn—Ag). The solder ball 17 is provided on the barrier metal layer 16 and covers the whole of the barrier metal layer 16. The solder ball 17 may be partially in contact with the seed metal layer 15.

Figure 4:
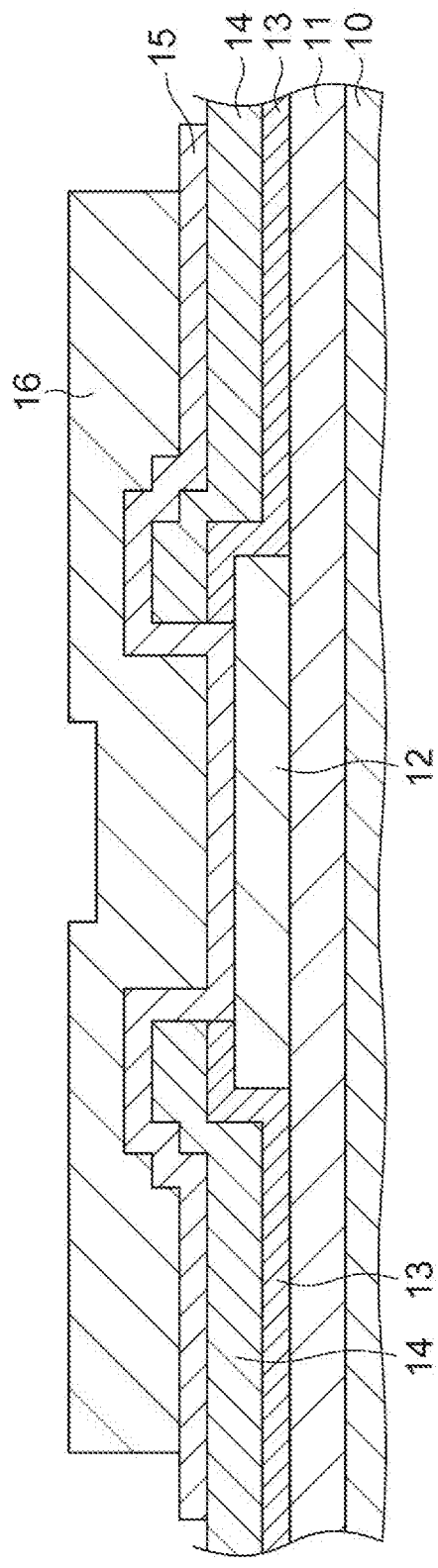
FIG. 4 is a cross-sectional view showing a step in accordance with the manufacturing method of the semiconductor device 1A.

A description will be given below of a manufacturing method of the above-described semiconductor device 1A. FIGS. 3A, 3B and 4 are cross-sectional views showing steps in accordance with the manufacturing method of the semiconductor device 1A.

First, epitaxial growth of the semiconductor region 10 is made on a substrate. This growth is made by, for example, metal organic chemical vapor deposition (MOCVD). Next, electrodes (not shown) (for example, a gate electrode, a source electrode, and a drain electrode) are formed on the semiconductor region 10. A resist mask having an opening is formed on the semiconductor region 10, metal serving as an electrode material is vapor deposited in the opening of the resist mask and on the resist mask, and the metal on the resist mask is removed (lifted off) together with the resist mask, thereby forming the electrodes.

Subsequently, as shown in FIG. 3A, the inorganic insulating layer 11 is formed on the semiconductor region 10. The inorganic insulating layer 11 can be formed by, for example, plasma CVD. Subsequently, the metal wiring 12 having a predetermined planar pattern is formed on the inorganic insulating layer 11 by, for example, electroplating. At this time, the metal wiring 12 and the electrodes are connected to each other through an opening formed in the inorganic insulating layer 11.

Subsequently, the inorganic insulating layer 13 and the organic insulating layer 14 are formed on the surface of the semiconductor region 10 where the metal wiring 12 is provided (first step). The inorganic insulating layer 13 is formed by, for example, plasma CVD. The organic insulating layer 14 is formed by, for example, spin coating of a material (for example, polyimide) of the organic insulating layer 14 on the semiconductor region 10. Then, a mask (not shown) having an opening corresponding to the openings 13a, 14a is formed on the organic insulating layer 14, and the organic insulating layer 14 is etched through the mask to form the opening 14a. A material of the mask is, for example, SiN or $SiO_2$. The opening of the mask is formed by photolithography or electron-beam lithography. Thereafter, the inorganic insulating layer 13 is etched through the opening 14a to form the opening 13a. Note that the openings 13a, 14a may be formed by dry etching using plasma.

Subsequently, the part of the metal wiring 12 exposed from the openings 13a, 14a, the inside face of the opening 14a of the organic insulating layer 14, the inside face of the opening 13a of the inorganic insulating layer 13, and the periphery of the opening 14a of the organic insulating layer 14 are covered by the seed metal layer 15 (second step). The seed metal layer 15 is formed through vapor deposition and lift-off, as with each of the electrodes. That is, a resist mask having an opening corresponding to a planar position and planar shape of the seed metal layer 15 is formed on the organic insulating layer 14. Then, metal serving as a material of the seed metal layer 15 is vapor deposited in the opening of the resist mask and on the resist mask, and the metal on the resist mask is removed (lifted off) together with the resist mask.

Subsequently, a mask R is formed on the organic insulating layer 14 (third step). The mask R has an opening Ra on the seed metal layer 15, and the opening Ra is larger in diameter than the opening 14a and smaller in diameter than the seed metal layer 15. Therefore, the opening Ra lies within the seed metal layer 15 when viewed in the thickness direction of the semiconductor region 10, and part of the mask R around the opening Ra covers the edge 15a of the seed metal layer 15. A distance W2 between an inside face of the opening Ra of the mask R and the edge 15a of the seed metal layer 15 is in a range of 4 μm to 8 μm, for example. Further, the opening Ra of the mask R exposes part of the seed metal layer 15 formed in the openings 13a, 14a.

The mask R primarily contains an organic material. For example, the mask R contains a negative resist. As one example, the mask R is made from the negative resist. With such a configuration, the negative resist is applied onto the organic insulating layer 14 and the seed metal layer 15, and a region other than a region corresponding to the opening Ra is exposed and developed, thereby allowing only the unexposed region corresponding to the opening Ra to be removed.

Subsequently, as shown in FIG. 3B, the barrier metal layer 16 is formed on the seed metal layer 15 exposed from the opening Ra of the mask R (fourth step). At this time, the barrier metal layer 16 is formed by electroless plating using the seed metal layer 15 as a seed metal. Specifically, the barrier metal layer 16 is formed by electroless plating (for example, autocatalytic electroless plating) using hypophosphite as a catalyst for autocatalytic plating. The reason for using electroless plating is that electroless plating is more reliable than electroplating.

Electroless plating is a method for applying plating without using an external power supply, and examples of electroless plating include displacement plating using ionization tendency, autocatalytic electroless plating (reduction plating) using a reducing agent, and displacement reduction plating that is a combination of displacement plating and reduction plating. Although autocatalytic electroless plating is used herein, another electroless plating may be used. On the other hand, electroplating is a method for applying plating by causing, with an external power supply, an electric current to flow between electrodes to supply electrons from the cathode.

In this step, an exposed surface of the seed metal (seed metal layer 15) for electroless plating is defined by the mask R. Therefore, the barrier metal layer 16 grows within a section defined by the mask R (within the opening Ra). The mask R restricts lateral growth of the barrier metal layer 16. As a result, the opening Ra is filled with the barrier metal layer 16.

Subsequently, an Au layer 51 (see FIG. 2) is formed on the barrier metal layer 16. The Au layer 51 is formed by, for example, electroless plating, electroplating, vapor deposition and lift-off, or sputtering. Thereafter, as shown in FIG. 4, the mask R is removed. After the mask R is removed, a surface of the organic insulating layer 14 may be irradiated with oxygen plasma for a short time. This allows an organic component of the organic insulating layer 14 to react with oxygen to make a surface condition of the organic insulating layer 14 better.

Thereafter, the solder ball 17 (see FIG. 2) is formed on the barrier metal layer 16 (on the Au layer 51) (fifth step). In this step, after flux is applied, the solder ball 17 having a diameter of, for example, 160 μm is formed by reflow (heat treatment) at, for example, 250° C. Almost all of the Au formed continuously with the seed metal layer 15 diffuses into the solder ball 17 in this step. Thereafter, the flux is washed off. Through the above steps, the semiconductor device 1A of the present embodiment shown in FIGS. 1 and 2 is manufactured.

Figure 12:
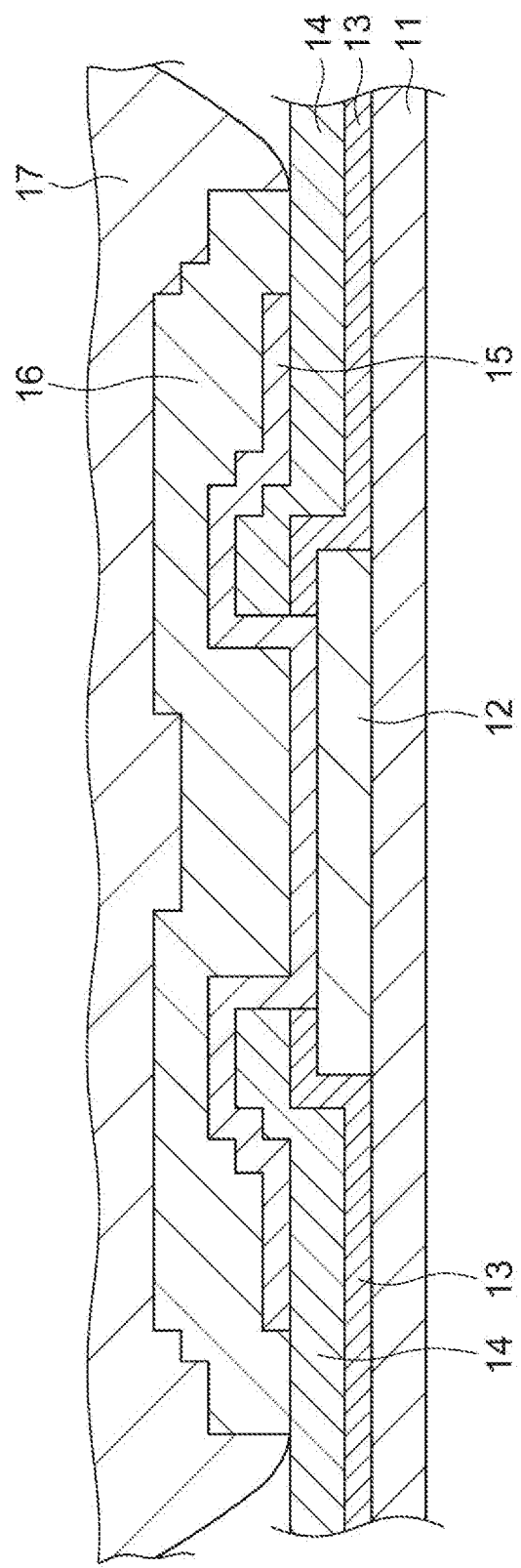
FIG. 12 is an enlarged cross-sectional view of a base structure for the solder ball 17 manufactured in accordance with a conventional method.

A description will be given of effects obtained by the manufacturing method of the semiconductor device 1A according to the present embodiment described above together with problems of a conventional manufacturing method. FIG. 12 is an enlarged cross-sectional view of a base structure for the solder ball 17 manufactured in accordance with a conventional method. In accordance with the conventional method, the barrier metal layer 16 is formed without the mask R shown in FIG. 3A. With such a configuration, as shown in FIG. 12, the barrier metal layer 16 grows laterally beyond the seed metal layer 15 and reaches the organic insulating layer 14 that is not covered by the seed metal layer 15.

Typically, a BGA-type semiconductor device is mounted on a printed wiring board having a wiring pattern in accordance with the BGA. The printed wiring board is formed, in many cases, using a resin substrate as a base. On the other hand, the substrate of the semiconductor device is made from a semiconductor or an inorganic insulator. Therefore, a difference in thermal expansion coefficient between the printed wiring board and the substrate of the semiconductor device is large, and thus a change in temperature during the formation of the solder ball 17, a change in ambient temperature under a usage environment, and the like apply stress to the printed wiring board and the substrate of the semiconductor device. In general, since the semiconductor device is smaller than the printed wiring board, it is assumed that the solder ball absorbs such stress to some extent, but some stress is also applied to the substrate of the semiconductor device. This stress causes separation of the base structure for the solder ball from the semiconductor device. In particular, as shown in FIG. 12, when there is part where the seed metal layer 15 is not interposed between the organic insulating layer 14 and the barrier metal layer 16, since a difference in thermal expansion coefficient between the organic insulating layer 14 and the barrier metal layer 16 is large and adhesiveness between the organic insulating layer 14 and the barrier metal layer 16 is low, the barrier metal layer 16 is easily separated from the organic insulating layer 14. Note that a thermal expansion coefficient of polyimide constituting the organic insulating layer 14 is about $25 \times 10^{-6}/°$ C., and a thermal expansion coefficient of Ni constituting the barrier metal layer 16 is in a range of $13 \times 10^{-6}/°$ C. to $16 \times 10^{-6}/°$ C.

In order to address such a problem, according to the present embodiment, during manufacture of the semiconductor device 1A, the mask R covering the edge 15a of the seed metal layer 15 is formed, and the barrier metal layer 16 is caused to grow only within the opening Ra of the mask R. This only allows the longitudinal growth of the barrier metal layer 16 and restricts the lateral growth of the barrier metal layer 16. Thus, it is possible to prevent the barrier metal layer 16 from growing onto the organic insulating layer 14 beyond the edge 15a of the seed metal layer 15. Therefore, according to the present embodiment, it is possible to reduce breakage at the interface between the barrier metal layer 16 and the metal wiring 12 caused by the intrusion of the solder and in turn increase the reliability of the semiconductor device 1A. Further, according to the present embodiment, only the steps of forming and removing the mask R need to be added to the conventional manufacturing method, and thus an increase in the number of manufacturing steps can be suppressed.

The mask R of the present embodiment primarily contains an organic material. It is also conceivable that the mask R is made from metal such as Cu, but the formation of the mask R using an organic material brings about the following advantages. That is, when the barrier metal layer 16 is made thicker in order to further increase the reliability of the semiconductor device, the mask R needs to be made thicker accordingly. The organic material has low rigidity and high flexibility as compared with metal, so that, even when being made thicker, the mask R is less susceptible to ambient stress.

After the step of forming the barrier metal layer 16, a step of forming the solder ball 17 on the barrier metal layer 16 may be provided. When the solder ball 17 is formed, there is a large temperature change due to the reflow. According to the manufacturing method of the present embodiment, even in such a case, it is possible to prevent the barrier metal layer 16 from being separated and increase the reliability of the semiconductor device 1A.

A step of forming the Au layer 51 on the barrier metal layer 16 may be provided without interruption after the step of forming the barrier metal layer 16. This makes it possible to increase wettability of the surface of the barrier metal layer 16 facing the solder ball 17 and thus easily form the solder ball 17. The subsequent heat treatment step diffuses almost all of the Au layer 51 into the solder ball 17 and eventually causes the Au layer 51 to disappear.

The mask R may contain a negative resist, and the step of removing the mask R may be provided after the step of forming the barrier metal layer 16. When a positive resist is used, the resist on part irradiated with light during exposure is removed by development, and part not irradiated with light during exposure is left. Uneven irradiation with light may generate a residue in the opening of the resist (that is, on the seed metal layer 15). This residue may reduce the adhesiveness between the seed metal layer 15 and the barrier metal layer 16. On the other hand, when the negative resist is used, the resist on the part irradiated with light during exposure is left at the time of development, and the part not irradiated with light during exposure is removed by development. This makes a residue less likely to generate in the opening of the resist (that is, on the seed metal layer 15). Thus, it is possible to suppress a decrease in adhesiveness between the seed metal layer 15 and the barrier metal layer 16.

The negative resist tend to have low viscosity, short exposure time, and low required exposure as compared with the positive resist. Therefore, since the negative resist is easily developed as compared with the positive resist, a residue is less likely to occur. Further, the negative resist can be easily dissolved with a remover in a short time as compared with the positive resist, and thus variations in characteristics of the semiconductor device 1A can be suppressed.

Forming the negative resist thicker allows the inside face of the opening to be easily formed into a flared shape. When the inside face of the opening of the resist has a flared shape, the barrier metal layer 16 has a trapezoidal shape. Conversely, when the inside face of the opening of the resist has a tapered shape, the barrier metal layer 16 has an inverted trapezoidal shape. The solder ball 17 formed on the barrier metal layer 16 is bonded by wettability, and thus the barrier metal layer 16 having an inverted trapezoidal shape makes the solder ball 17 difficult to reach the side surfaces of the barrier metal layer 16, makes a bonding surface smaller, causes process variations, and causes air to enter to create a void. When the barrier metal layer 16 has a trapezoidal shape, the solder ball 17 is bonded to almost the whole of the surface of the barrier metal layer 16, which eliminates the above-described inconvenience and increases the adhesiveness. As described above, forming the inside face of the opening of the resist into a flared shape allows the shape of the barrier metal layer 16 to be easily changed and thus allows strength of adhesiveness to the solder ball 17 to be increased.

The barrier metal layer 16 may be an Ni layer and have a thickness in a range of 3 µm to 6 µm. Ni and solder are less likely to mutually diffuse, and thus Ni is suitable as a base of the solder ball 17. Further, providing the Ni layer having such a thickness makes it possible to further increase the reliability of the semiconductor device 1A.

The seed metal layer 15 may include a Ti layer and a Pd layer provided on the Ti layer, the Ti layer may have a thickness of 50 nm, and the Pd layer may have a thickness of 100 nm. With this configuration, the presence of the Ti layer increases the adhesiveness between the seed metal layer 15 and the metal wiring 12, while the presence of the Pd layer allows the electroless plating on the barrier metal layer 16 to be easily conducted.

In the step of forming the mask R, the distance W2 between the edge 15a of the seed metal layer 15 and the inner edge of the mask R may be in a range of 4 µm to 8 µm. This makes it possible to secure the distance W1, in a range of 4 µm to 8 µm, between the edge 16a of the barrier metal layer 16 and the edge 15a of the seed metal layer 15 after the removal of the mask R and thus satisfactorily obtain the above-described effects of the present embodiment.

Second Embodiment

Figure 5:
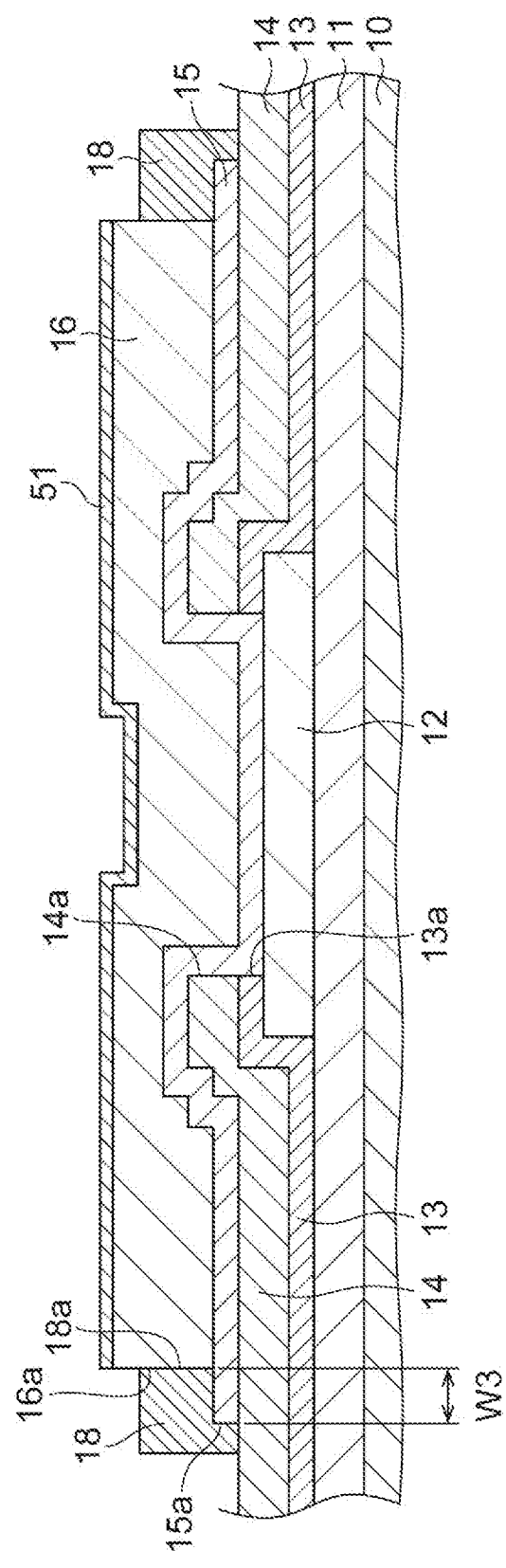
FIG. 5 is an enlarged cross-sectional view showing a base structure for a solder ball 17 of a semiconductor device according to a second embodiment.

FIG. 5 is an enlarged cross-sectional view showing a base structure for the solder ball 17 of a semiconductor device according to a second embodiment. Note that the solder ball 17 is not shown. The present embodiment differs from the first embodiment described above in the material of the mask. According to the present embodiment, a mask 18 primarily containing an inorganic dielectric material is provided instead of the mask R of the first embodiment primarily containing an organic material. In one example, the mask 18 primarily contains an insulating silicon compound. The insulating silicon compound is, for example, SiN or SiO$_2$. The mask 18 is left in the semiconductor device even after the semiconductor device is manufactured. In other words, the semiconductor device of the present embodiment further includes the mask 18 in addition to the constituents of the first embodiment.

The mask 18 has an opening 18a on the seed metal layer 15, and the opening 18a is larger in diameter than the opening 14a and smaller in diameter than the seed metal layer 15. Therefore, the opening 18a lies within the seed metal layer 15 when viewed in the thickness direction of the semiconductor region 10, and part of the mask 18 near the opening 18a covers the edge 15a of the seed metal layer 15. A distance W3 between an inside face of the opening 18a of the mask 18 and the edge 15a of the seed metal layer 15 is in a range of 4 µm to 8 µm, for example. Further, the opening 18a of the mask 18 exposes part of the seed metal layer 15 formed in the openings 13a, 14a. A thickness of the mask 18 is determined in accordance with the thickness of the barrier metal layer 16 and is in a range of 1.0 µm to 3.5 µm, for example.

The barrier metal layer 16 is provided on the seed metal layer 15 exposed from the mask 18. An outside face (outer edge 16a) of the barrier metal layer 16 is in contact with the inside face of the opening 18a of the mask 18 and is located inside (located closer to the opening 14a than) the edge 15a of the seed metal layer 15. In other words, when viewed in the thickness direction of the barrier metal layer 16, the barrier metal layer 16 is provided within a section defined by the mask 18. Note that the mask 18 has, for example, an annular shape in plan view.

FIGS. 6A to 6C are cross-sectional views showing steps in accordance with a semiconductor device manufacturing method of the present embodiment. First, as in the first embodiment, the semiconductor region 10, the inorganic insulating layer 11, the metal wiring 12, the inorganic insulating layer 13, the organic insulating layer 14, and the seed metal layer 15 are formed in this order. Next, the mask 18 is formed on the organic insulating layer 14. Specifically, as shown in FIG. 6A, a film 18A made from a constituent material of the mask 18 is first formed on the whole of the semiconductor region 10. Next, a resist mask is formed on the edge 15a by photolithography. Then, the film 18A exposed from the resist mask is removed by etching. This allows, as shown in FIG. 6B, the mask 18 covering the edge 15a to be formed. Thereafter, the resist mask is removed.

Subsequently, as shown in FIG. 6C, the barrier metal layer 16 is formed on the seed metal layer 15 exposed from the mask 18. At this time, the barrier metal layer 16 is formed by electroless plating using the seed metal layer 15 as a seed metal. In this step, an exposed surface of the seed metal (seed metal layer 15) for electroless plating is defined by the mask 18. Therefore, the barrier metal layer 16 grows within a section defined by the mask 18 (within the opening 18a). The mask 18 restricts lateral growth of the barrier metal layer 16. As a result, the opening 18a is filled with the barrier metal layer 16. The subsequent steps are the same as in the first embodiment.

According to the present embodiment, during manufacture of the semiconductor device, the mask 18 covering the edge 15a of the seed metal layer 15 is formed, and the barrier metal layer 16 is caused to grow only within the opening 18a of the mask 18. This only allows the longitudinal growth of the barrier metal layer 16 and restricts the lateral growth of the barrier metal layer 16. Thus, it is possible to prevent the barrier metal layer 16 from growing onto the organic insulating layer 14 beyond the edge 15a of the seed metal layer 15. Therefore, according to the present embodiment, it is also possible to reduce breakage at the interface between the barrier metal layer 16 and the metal wiring 12 caused by the intrusion of the solder and in turn increase the reliability of the semiconductor device 1A.

According to the present embodiment, unlike the first embodiment, the mask 18 primarily contains an inorganic dielectric material. This configuration allows the mask 18 to be left without being removed, and thus makes it possible to prevent the edge 15a of the seed metal layer 15 and the vicinity of the edge 15a from being exposed. This in turn makes it possible to suppress deterioration of the periphery of the seed metal layer 15.

The inorganic dielectric material (for example, SiN) and the organic material (for example, polyimide) have thermal expansion coefficients equivalent to each other. This makes it possible to reduce stress generated by a temperature change and thus suppress separation of the mask 18 from the organic insulating layer 14, which in turn makes it possible to further increase the reliability of the semiconductor device 1A. Note that the mask 18 is in contact with the barrier metal layer 16, and a difference in thermal expansion coefficient between the barrier metal layer 16 and the mask 18 is large. Accordingly, when the barrier metal layer 16 repeatedly expands and contracts in response to the temperature change, the stress is applied to the mask 18. However, even when a crack is formed in the mask 18, the crack does not grow further, so that the adhesion between the mask 18 and the organic insulating layer 14 is maintained, and the intrusion of solder is suppressed.

Examples of a method for further increasing the adhesiveness between the mask 18 and the organic insulating layer 14 include changing a film quality of the mask 18 in the thickness direction. That is, it is preferable that part of the mask 18 in contact with the organic insulating layer 14 be low in density of the inorganic dielectric material, and the density of the inorganic dielectric material gradually increases as a distance from the organic insulating layer 14 increases. Such a mask 18 can be formed by stacking a plurality of layers having different film qualities or by continuously changing the film quality in the thickness direction.

Modification

Figure 7A:
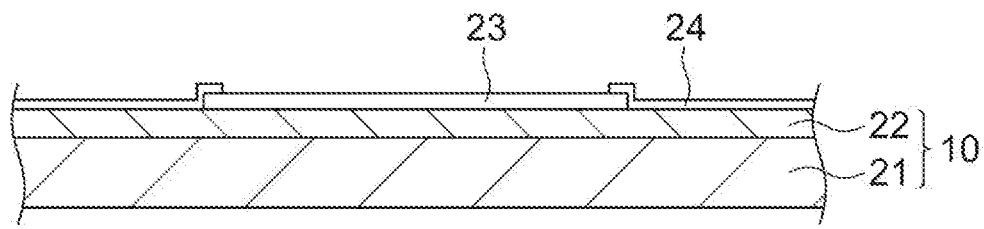
FIGS. 7A to 7C are views showing steps included in a semiconductor device manufacturing method according to one modification.

FIGS. 7A to 11B are views showing steps included in a semiconductor device manufacturing method according to a modification of the first embodiment. First, as shown in FIG. 7A, epitaxial growth of a semiconductor layer 22 is made on a semiconductor substrate 21 to form a semiconductor region 10. Next, an electrode 23 is formed on the semiconductor layer 22 to come into contact with the semiconductor layer 22, and respective surfaces of the electrode 23 and the semiconductor layer 22 are covered by a passivation film 24. The electrode 23 is, for example, an ohmic electrode. The passivation film 24 is, for example, an SiN film. Then, an opening is formed in the passivation film 24 to expose the electrode 23.

Figure 7B:
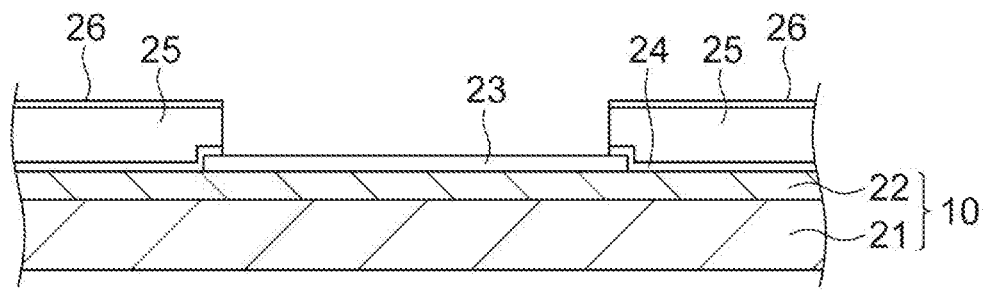

Next, as shown in FIG. 7B, a polyimide layer 25 (bottom layer) is applied, and an SiN layer 26 is formed on the polyimide layer 25. The polyimide layer 25 has a thickness of, for example, 1.4 μm, and the SiN layer 26 has a thickness of, for example, 100 nm. Then, a resist pattern is formed on the SiN layer 26, and the SiN layer 26 is etched through the resist pattern to form an opening that exposes the polyimide layer 25. After the resist pattern is removed, the polyimide layer 25 is etched through the opening of the SiN layer 26 to form an opening that exposes the electrode 23.

Figure 7C:
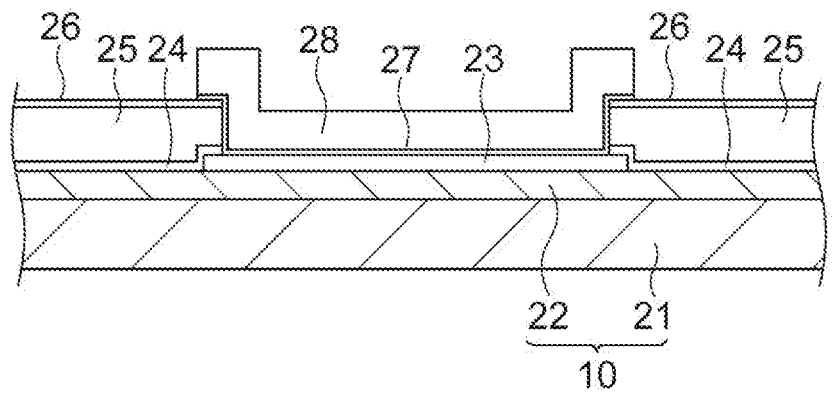

Subsequently, as shown in FIG. 7C, a seed metal 27 and metal wiring 28 (bottom layer) are formed on the electrode 23. The seed metal 27 has a thickness of, for example, 515 nm. The metal wiring 28 is made from, for example, Au and has a thickness of, for example, 1 μm. Specifically, first, the seed metal 27 is vapor deposited on the whole of the semiconductor region 10, and a resist pattern having an opening including the opening of the SiN layer 26 when viewed in the thickness direction is formed on the seed metal 27. Thereafter, the metal wiring 28 is formed in the opening of the resist pattern by electroplating. After the resist pattern is stripped, part of the seed metal 27 exposed from the metal wiring 28 is removed by etching. Thereafter, heat treatment is made. A heat treatment temperature is, for example, 350° C. Since metal immediately after plating is in a so-called sparse state, the heat treatment allows the metal to recover to a normal state.

Figure 8A:
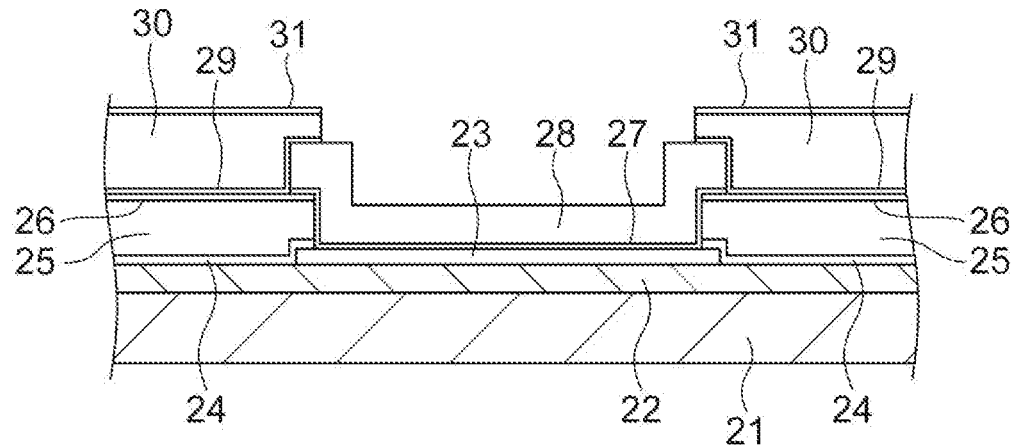
FIGS. 8A to 8C are views showing steps included in the semiconductor device manufacturing method according to the one modification.

Subsequently, as shown in FIG. 8A, an SiN layer 29, a polyimide layer 30 (intermediate layer), and an SiN layer 31 are formed in this order. The polyimide layer 30 has a thickness of, for example, 2.0 μm, and the SiN layer 31 has a thickness of, for example, 130 nm. A resist pattern is formed on the SiN layer 31, and the SiN layer 31 is etched through the resist pattern to form an opening that exposes the polyimide layer 30. After the resist pattern is removed, the polyimide layer 30 and the SiN layer 29 are etched through the opening of the SiN layer 31 to form an opening that exposes the metal wiring 28.

Figure 8B:
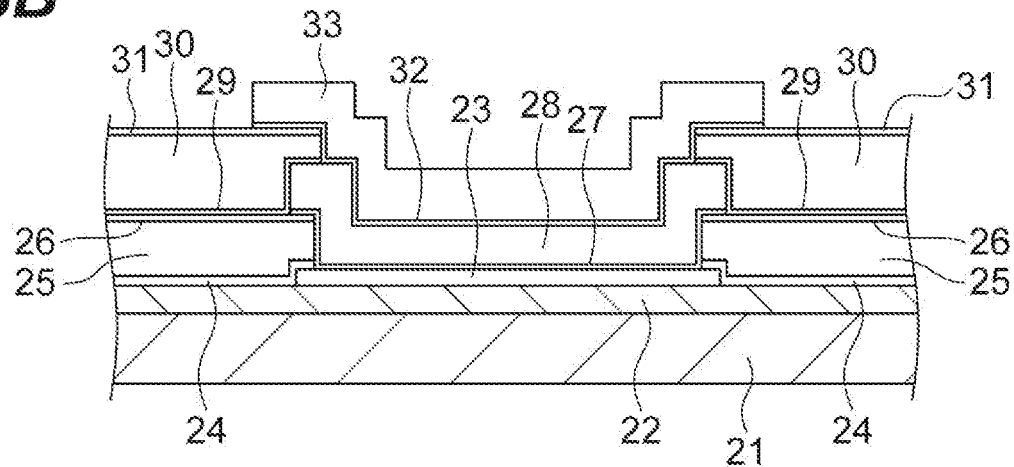

Subsequently, as shown in FIG. 8B, a seed metal 32 and metal wiring 33 (intermediate layer) are formed on the metal wiring 28. The seed metal 32 has a thickness of, for example, 205 nm. The metal wiring 33 is made from, for example, Au and has a thickness of, for example, 1 μm. Note that a method for forming the seed metal 32 and the metal wiring 33 is the same as the method for forming the seed metal 27 and the metal wiring 28 described above.

Figure 8C:
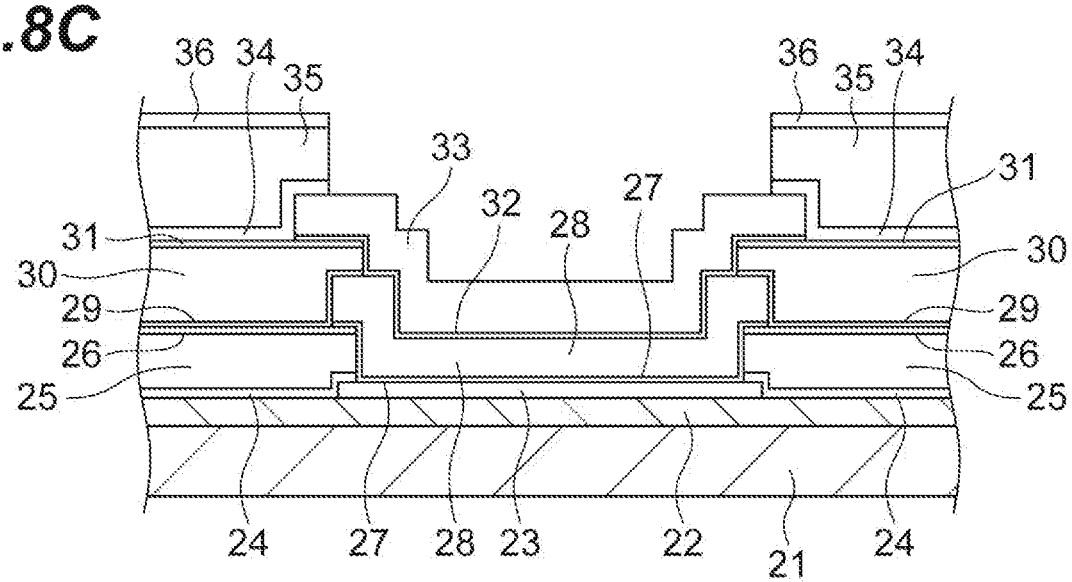

Subsequently, as shown in FIG. 8C, an SiN layer 34, a polyimide layer 35, and an SiN layer 36 are formed in this order. The SiN layer 34 has a thickness of, for example, 300 nm, the polyimide layer 35 has a thickness of, for example, 2.0 μm, and the SiN layer 36 has a thickness of, for example, 300 nm. A resist pattern is formed on the SiN layer 36, and the SiN layer 36 is etched through the resist pattern to form an opening that exposes the polyimide layer 35. After the resist pattern is removed, the polyimide layer 35 and the SiN layer 34 are etched through the opening of the SiN layer 36 to form an opening that exposes the metal wiring 33.

Figure 9A:
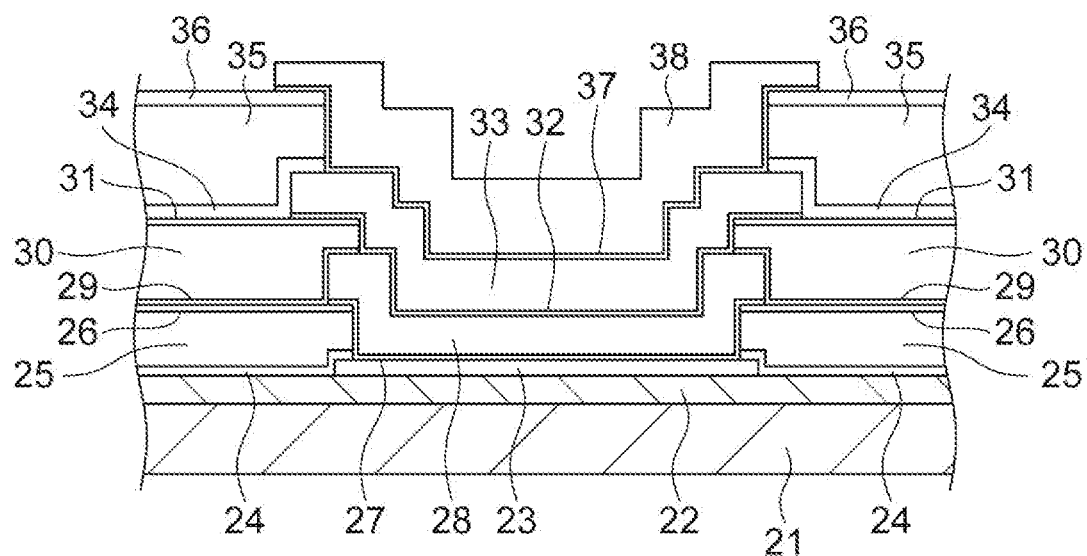
FIGS. 9A and 9B are views showing steps included in the semiconductor device manufacturing method according to the one modification.

Subsequently, as shown in FIG. 9A, a seed metal 37 and metal wiring 38 (intermediate layer) are formed on the metal wiring 33. The seed metal 37 has a thickness of, for example, 205 nm. The metal wiring 38 is made from, for example, Au and has a thickness of, for example, 1 μm. Note that a method for forming the seed metal 37 and the metal wiring 38 is the same as the method for forming the seed metal 27 and the metal wiring 28 described above.

Figure 9B:
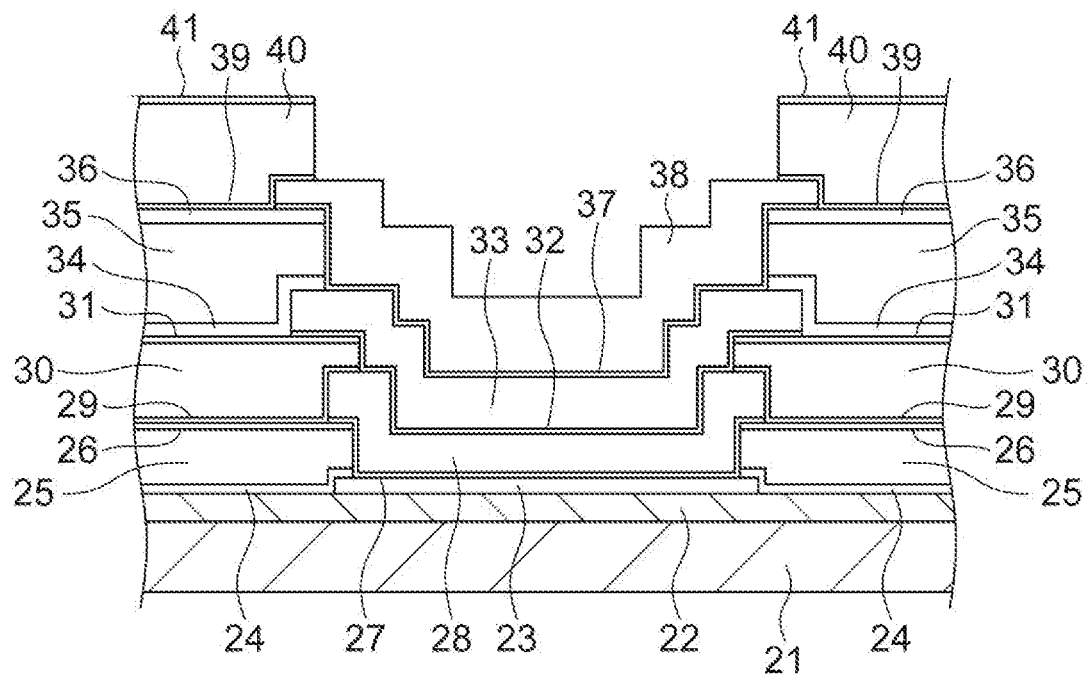

Subsequently, as shown in FIG. 9B, an SiN layer 39, a polyimide layer 40 (intermediate layer), and an SiN layer 41 are formed in this order. The SiN layer 39 has a thickness of, for example, 200 nm, the polyimide layer 40 has a thickness of, for example, 2.0 μm, and the SiN layer 41 has a thickness of, for example, 200 nm. A resist pattern is formed on the SiN layer 41, and the SiN layer 41 is etched through the resist pattern to form an opening that exposes the polyimide layer 40. After the resist pattern is removed, the polyimide layer 40 and the SiN layer 39 are etched through the opening of the SiN layer 41 to form an opening that exposes the metal wiring 38.

Figure 10A:
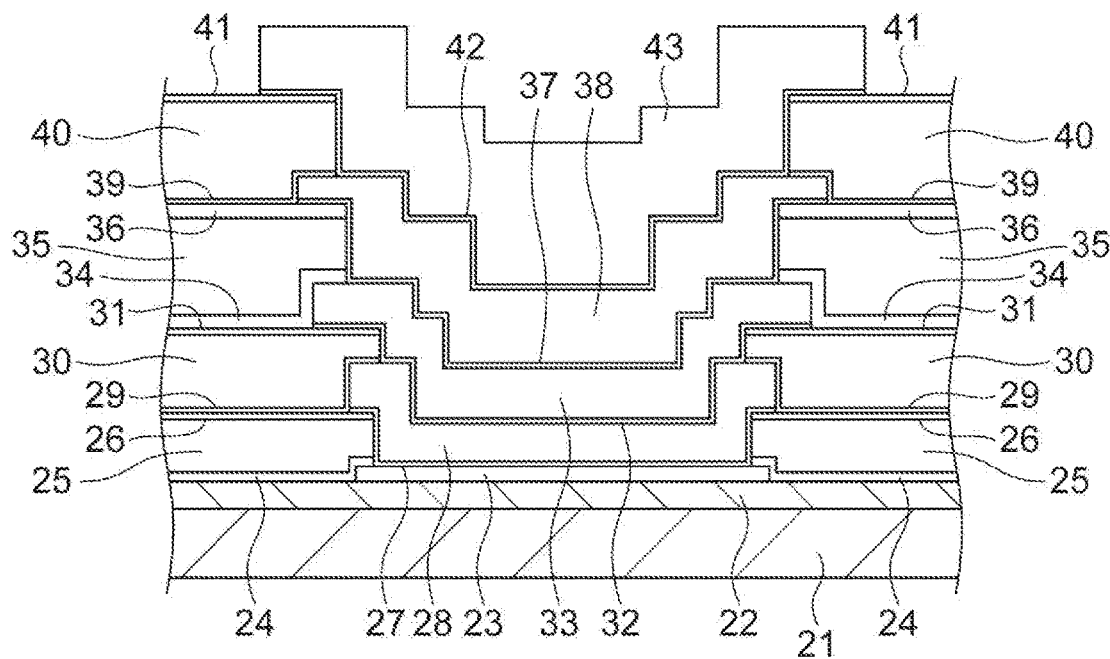
FIGS. 10A and 10B are views showing steps included in the semiconductor device manufacturing method according to the one modification.

Subsequently, as shown in FIG. 10A, a seed metal 42 and metal wiring 43 (top layer) are formed on the metal wiring 38. The seed metal 42 has a thickness of, for example, 205 nm. The metal wiring 43 is made from, for example, Au and has a thickness of, for example, 2 μm. Note that a method for forming the seed metal 42 and the metal wiring 43 is the same as the method for forming the seed metal 27 and the metal wiring 28 described above.

Figure 10B:
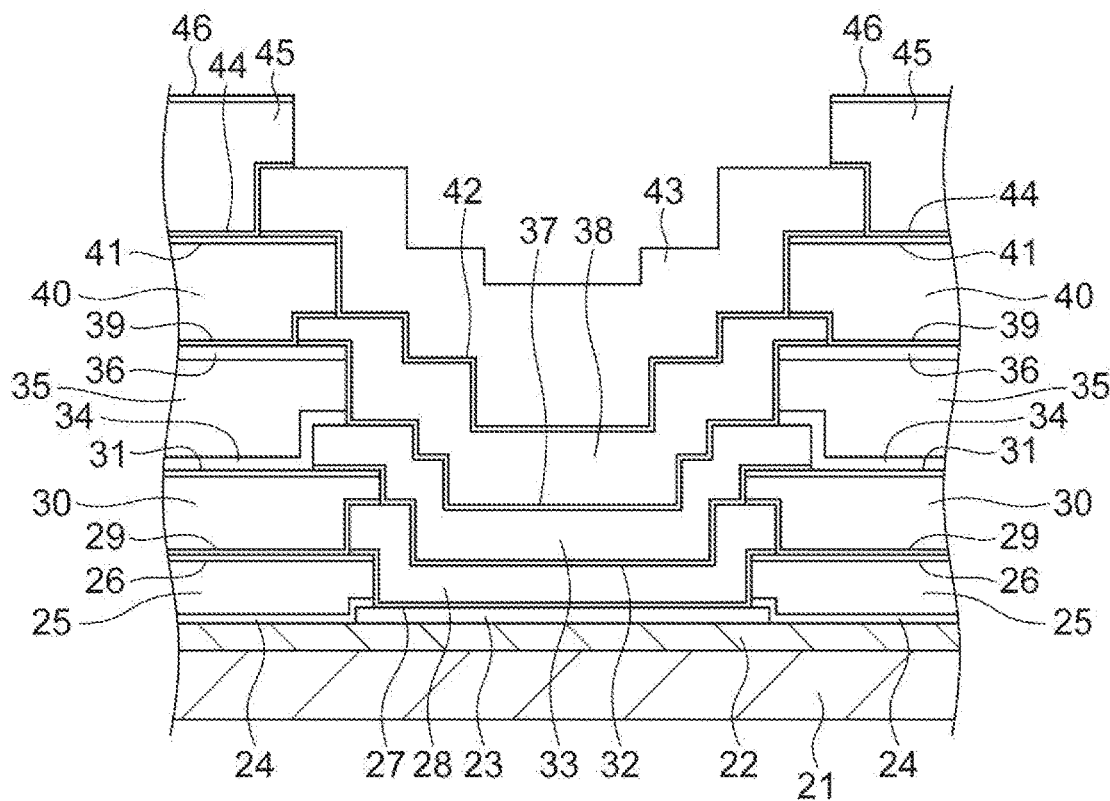

Subsequently, as shown in FIG. 10B, an SiN layer 44, a polyimide layer 45 (top layer), and an SiN layer 46 are formed in this order. The SiN layer 44 has a thickness of, for example, 200 nm, the polyimide layer 45 has a thickness of, for example, 6.0 μm, and the SiN layer 46 has a thickness of, for example, 200 nm. A resist pattern is formed on the SiN layer 46, and the SiN layer 46 is etched through the resist pattern to form an opening that exposes the polyimide layer 45. After the resist pattern is removed, the polyimide layer 45 and the SiN layer 44 are etched through the opening of the SiN layer 46 to form an opening that exposes the metal wiring 43. Note that, according to the present modification, the metal wiring 43 corresponds to the metal wiring 12 of the first embodiment, the SiN layer 44 corresponds to the inorganic insulating layer 13 of the first embodiment, and the polyimide layer 45 corresponds to the organic insulating layer 14 of the first embodiment.

Subsequently, as shown in FIG. 11A, a seed metal layer 15 is formed on the metal wiring 43. Specifically, first, a resist pattern having an opening including the exposed part of metal wiring 43 is formed. A metal material of the seed metal layer 15 is vapor deposited in the opening of the resist pattern and on the resist pattern, and the metal material on the resist pattern is removed (lifted off) together with the resist pattern. Note that constituents of the seed metal layer 15 are the same as in the first embodiment described above.

Subsequently, as shown in FIG. 11B, a mask R having an opening Ra is formed, and a barrier metal layer 16 is formed in the opening Ra by electroless plating. Specific shapes and constituent materials of the mask R and the barrier metal layer 16 are the same as in the first embodiment described above. The barrier metal layer 16 has a thickness in a range of 3 μm to 6 μm, for example. Thereafter, an Au layer 51 (see FIG. 1) is formed on the barrier metal layer 16 by electroless plating. The Au layer 51 has a thickness of, for example, 10 nm. The mask R is removed, and solder balls 17 (see FIG. 1) are formed, and then the semiconductor device is completed.

The semiconductor device manufacturing method and the semiconductor device according to the present disclosure are not limited to the above-described embodiments, and various other modifications are possible. For example, according to the first embodiment, the photoresist has been given as an example of the organic dielectric material constituting the mask that restricts the lateral growth of the barrier metal layer. Various other materials may be used as the organic dielectric material. Further, according to the second embodiment, the insulating silicon compound (SiN or $SiO_2$) has been used as an example of the inorganic dielectric material constituting the mask that restricts the lateral growth of the barrier metal layer. Various other materials may be used as the inorganic dielectric material. According to each of the above-described embodiments, the HEMT has been given as an example of the semiconductor region, but the manufacturing method according to the present disclosure is not limited to the HEMT and is applicable to various semiconductor devices provided with metal wiring and solder balls.

What is claimed is:

1. A semiconductor device manufacturing method comprising:
    forming an organic insulating layer on a semiconductor on which metal wiring is provided, the organic insulating layer having an opening to expose a part of the metal wiring;
    forming a seed metal covering the part of the metal wiring exposed from the opening, an inside face of the organic insulating layer in the opening, and a portion of the organic insulating layer around the opening;
    forming a mask covering an edge of the seed metal while exposing part of the seed metal formed in the opening, the mask including an inorganic dielectric material;
    forming a barrier metal on the seed metal exposed from the mask by electroless plating;
    without removing the mask, forming a solder ball on the barrier metal; and
    reflowing the solder ball on the barrier metal and the mask.

2. The semiconductor device manufacturing method according to claim 1, wherein
    the solder ball is reflowed at 250° C., and
    the solder ball has a diameter of 160 μm.

3. The semiconductor device manufacturing method according to claim 1, further comprising:
    forming a gold (Au) layer on the barrier metal without interruption after the forming of the barrier metal,
    wherein the Au layer has a thickness of 10 nm.

4. The semiconductor device manufacturing method according to claim 1,
    wherein the mask includes an insulating silicon compound.

5. The semiconductor device manufacturing method according to claim 1,
    wherein the barrier metal is a nickel (Ni) layer with a thickness of from 3 μm to 6 μm.

6. The semiconductor device manufacturing method according to claim 1, wherein
    the seed metal includes titanium (Ti) and palladium (Pd) on the titanium, and
    a thickness of the titanium is 50 nm, and a thickness of the palladium is 100 nm.

7. The semiconductor device manufacturing method according to claim 1,
    wherein a distance between the edge of the seed metal and an inside edge of the mask is from 4 μm to 8 μm.

8. A semiconductor device manufacturing method comprising:
    forming an organic insulating layer on a semiconductor on which metal wiring is provided, the organic insulating layer having a first opening to expose a part of the metal wiring;

forming a seed metal layer covering the part of the metal wiring exposed from the first opening, an inside face of the organic insulating layer in the first opening, and a portion of the organic insulating layer around the first opening;

forming a mask covering an edge of the seed metal layer and the organic insulating layer, the mask having a second opening to expose part of the seed metal layer;

forming a barrier metal layer on the seed metal layer exposed from the second opening of the mask, the barrier metal layer being separated from the organic insulating layer;

without removing the mask, forming a solder ball on the barrier metal; and reflowing the solder ball on the barrier metal layer and the mask.

9. The semiconductor device manufacturing method according to claim 8, wherein the solder ball has a diameter of 160 μm by the flowing at 250° C.

10. The semiconductor device manufacturing method according to claim 8, further comprising:

forming an Au layer on the barrier metal layer without interruption after the forming of the barrier metal layer, wherein the Au layer has a thickness of 10 nm.

11. The semiconductor device manufacturing method according to claim 8, wherein the mask includes an insulating silicon compound, and the mask remains on the edge of the seed metal layer.

12. The semiconductor device manufacturing method according to claim 8, wherein the barrier metal layer is a Ni layer with a thickness of from 3 μm to 6 μm.

13. The semiconductor device manufacturing method according to claim 8, wherein the seed metal layer includes a Ti layer and a Pd layer on the Ti layer, and a thickness of the Ti layer is 50 nm, and a thickness of the Pd layer is 100 nm.

14. The semiconductor device manufacturing method according to claim 8, wherein a distance between the edge of the seed metal layer and an inside edge of the mask is from 4 μm to 8 μm.

* * * * *